(12) United States Patent
Kim

(10) Patent No.: US 6,175,777 B1
(45) Date of Patent: Jan. 16, 2001

(54) METHOD FOR TRANSFERRING WAFER CASSETTES AFTER CHECKING WHETHER PROCESS EQUIPMENT IS IN A SUITABLE MODE

(75) Inventor: Sang-yong Kim, Kyonggi-do (KR)

(73) Assignee: Samsung Electronics Co., Ltd., Suwon (KR)

( * ) Notice: Under 35 U.S.C. 154(b), the term of this patent shall be extended for 0 days.

(21) Appl. No.: 09/008,083

(22) Filed: Jan. 16, 1998

(30) Foreign Application Priority Data

Apr. 17, 1997 (KR) .................................................. 97-14263

(51) Int. Cl.[7] ..................................................... G06F 19/00
(52) U.S. Cl. ............................ 700/121; 700/169; 701/23; 701/25
(58) Field of Search ..................................... 700/159, 176, 700/117, 32, 121, 112, 115, 228, 229, 114, 113; 701/23–25; 180/167; 518/580; 29/469; 414/222.01, 222.06

(56) References Cited

U.S. PATENT DOCUMENTS 5,023,790 * 6/1991 Luke, Jr. ................................ 701/24
5,388,945 * 2/1995 Garric et al. .......................... 414/217
5,528,499 * 6/1996 Hagenbuch ............................ 701/50
5,536,128 * 7/1996 Shimoyashiro et al. ............. 414/273

\* cited by examiner

Primary Examiner—William Grant
Assistant Examiner—Kidest Bahta
(74) Attorney, Agent, or Firm—Jones Volentine, LLC (57) ABSTRACT

A method and system for transferring a wafer cassette between an Automated Guide Vehicle (AGV) and process equipment in a semiconductor fabrication facility involves transmitting a first signal from the AGV to the process equipment indicative of a cassette transfer request, checking whether the process equipment is in a suitable mode, setting the process equipment to the suitable mode after the checking step if the process equipment was not already in the suitable mode, and transferring the cassette between the AGV and the process equipment. A second transmitting step may be included, which sends a signal from the process equipment to the AGV authorizing the transfer of the cassette. The transmissions may be accomplished by wireless communications links such as a photo-coupled Parallel Input/Output link. A plurality of sensors may be used to detect whether a cassette is anywhere on a cassette stage during the checking step.

16 Claims, 6 Drawing Sheets

METHOD FOR TRANSFERRING WAFER CASSETTES AFTER CHECKING WHETHER PROCESS EQUIPMENT IS IN A SUITABLE MODE

BACKGROUND OF THE INVENTION

1. Field of the Invention

The present invention generally relates to a method for transferring wafer cassettes between semiconductor device process equipment and an Automated Guide Vehicle (AGV) at a semiconductor fabrication facility. More specifically, the present invention relates to a method that includes steps for checking the mode of the process equipment and changing the mode, if necessary, to a mode more suitable for the transfer that is to take place.

2. Description of the Related Art

The processes employed during the fabrication of semiconductor devices have become increasingly automated. Until recently, however, the transfer of semiconductor wafer cassettes among pieces of processing equipment has been a manual process involving a human operator. With the increasing integration of semiconductor devices, particles generated by the human body, formerly not considered to be a problem, have become a main cause of contamination. Consequently, much research and development has gone into automating the transfer of wafer cassettes. Automated Guide Vehicles (AGVs) have been developed to deliver cassettes under the remote control of a computer. Although great advances have been made, current systems still suffer some disadvantages. For example, if the process equipment is not in the correct mode when the cassette delivery unit arrives, the transfer may be initiated nonetheless. The result is that cassettes may not be transferred at all, or, worse, cassettes can be dropped and wafers spilled and broken.

Figure 1:
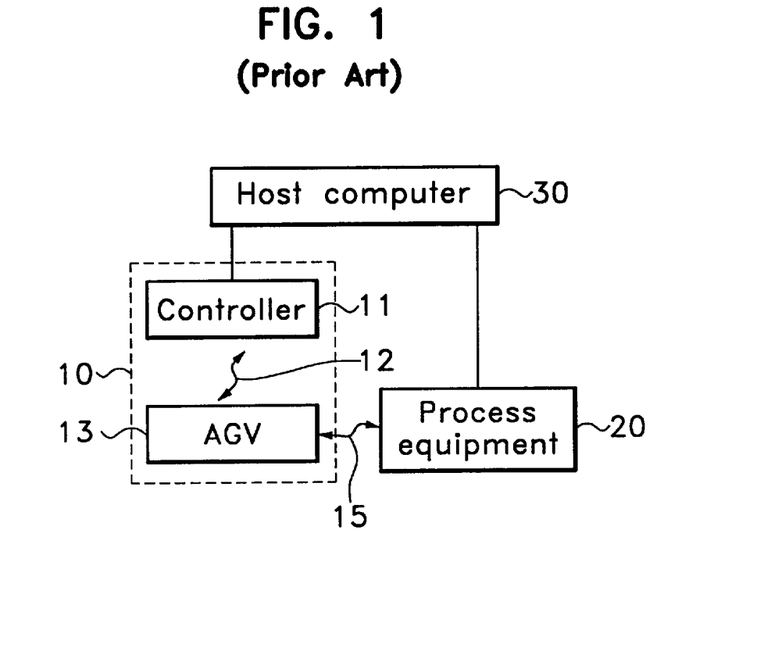
FIG. 1 is a schematic diagram of a wafer cassette transfer system using a current embodiment.

FIG. 1 is a schematic diagram of a current wafer transfer system using communications links between an AGV and its controller and between the AGV and some semiconductor fabrication process equipment. The system includes transfer equipment 10, process equipment 20, and a host computer 30. The transfer equipment 10 includes a controller 11 that itself is connected to and controlled by the host computer 30. The transfer equipment 10 also includes an AGV 13 that operates under radio control by the controller 11 through a radio link represented by the arrow 12. The process equipment 20 is simultaneously controlled by the host computer 30 through a second controller (not shown). The host computer 30 communicates with the transfer controller 11 and the process equipment controller (not shown) according to a Semiconductor Equipment Communication Standard (SECS). The AGV 13 communicates with the process equipment 20 through a communications link represented by another arrow 15. In the current system, a photo-coupled Parallel Input/Output (PPIO) link serves as the communications link 15.

A cassette transfer occurs when a wafer cassette (not shown) is loaded into the process equipment 20 from the AGV 13 or when a wafer cassette is unloaded from the process equipment 20 to the AGV 13. The process equipment 20 includes a loading/unloading cassette stage 21 (FIG. 2) used when wafer cassettes are transferred between the process equipment 20 and the AGV 13.

Figure 2:
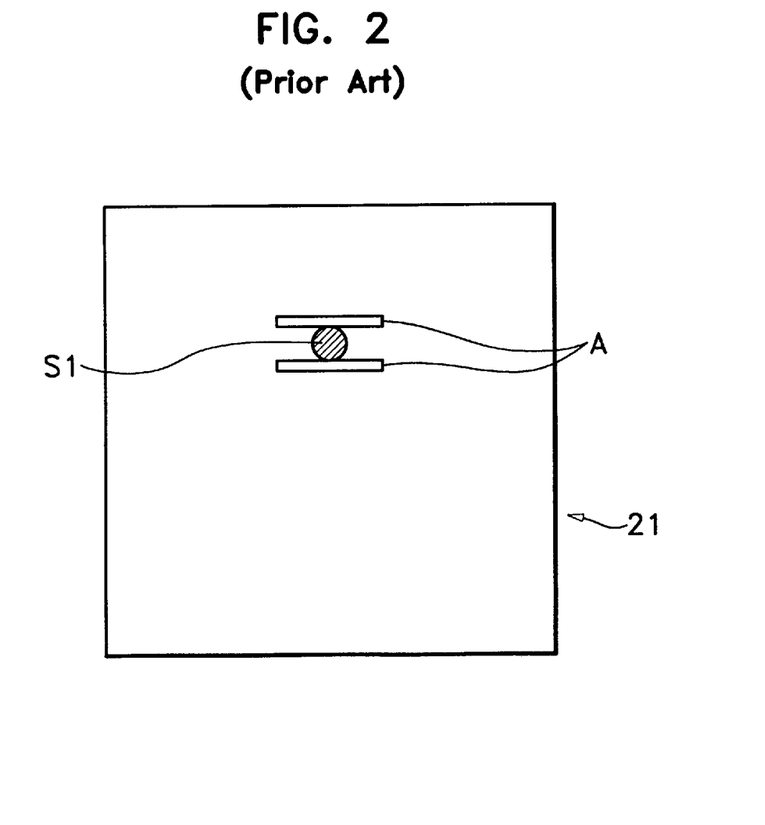
FIG. 2 is a schematic diagram showing a loading/unloading cassette stage of the process equipment of FIG. 1.

FIG. 2 is a schematic diagram showing the loading/unloading cassette stage 21 of the process equipment 20. The stage 21 contains a sensor S1 that can detect the presence of a cassette when the cassette is placed in a preferred location A on the stage 21.

The operation of the current wafer cassette transfer system will be described with reference to FIG. 1 and FIG. 2. Starting with FIG. 1, a command to transfer a wafer cassette is issued by the host computer 30 which communicates the command through the connections to the transfer equipment controller 11 and to the controller (not shown) of the process equipment 20 according to SECS. The transfer equipment controller 11 then utilizes the radio link 12 to instruct the AGV 13 to move toward the process equipment 20. As a result the AGV 13 arrives at the process equipment 20 adjacent to its loading/unloading cassette stage 21.

After arrival at the process equipment 20, the AGV 13 begins to communicate with the process equipment 20 via the communications link 15. In the case of the PPIO link, the communications protocol is defined by the Semiconductor Equipment and Material International (SEMI) standard. The process equipment 20 has internal mechanisms (not shown) that must be deployed in a certain fashion for loading or unloading operations. For example, the process equipment 20 may have a door that must be opened, or the process equipment 20 may have a robot arm that must be unfolded during loading and unloading. In addition, the cassette stage 21 must be occupied by a cassette to allow unloading to occur, or the stage 21 must be empty to allow loading to occur. The state of such various internal mechanisms and the state of occupancy of the stage 21 constitute the transfer mode of the process equipment 20. In the conventional wafer transfer system of FIG. 1, the process equipment 20 is considered to be in a mode suitable for the transfer as commanded by the host computer 30 when the AGV 13 arrives and begins communicating, regardless of whether the wafer transfer system is actually ready to load or unload a cassette.

For various reasons, however, the process equipment 20 may not be in a suitable transfer mode when the AGV begins communicating. When transfer begins while the processing equipment 20 is not in a suitable mode, for example, if the door is not completely open, or the robot arm is not completely unfolded, the cassette might not be placed on the stage 21 at the preferred location A in FIG. 2.

FIG. 2 shows that when a cassette is placed at the preferred location A on the stage 21, the sensor S1 can detect its presence. However, if the cassette is placed near the preferred location but not in the view of the sensor S1, the sensor S1 may indicate to the process equipment controller that the stage is empty. In this case, the process equipment controller will not clear the stage upon receiving the load command from the host computer 30. When the AGV 13 attempts to perform the load operation, the cassettes collide and the transfer operation fails. This faulty detection of cassette stage 21 occupancy is a main cause of failure for the transferring operations. In addition, cassettes may collide with a door that is not open or a robot arm that is not unfolded. For any of these reasons a cassette may be dropped during the failure of the transfer operation and wafers may be spilled. The current system is unable to check whether there are problems with the stage 21 occupancy or the internal mechanisms of the process equipment 20 prior to transferring wafer cassettes.

A need exists, therefore, for a wafer cassette transfer system that will not transfer cassettes if the process equipment is not in a suitable mode.

SUMMARY OF THE INVENTION

Accordingly, the present invention is directed to a method for transferring a wafer cassette between an AGV and process equipment in a semiconductor fabrication facility. The method comprises transmitting a first signal from the AGV to the process equipment indicative of a cassette transfer request, and checking whether the process equipment is in a suitable mode for the transfer request. If the process equipment was not already in a suitable mode, the next step sets the process equipment to the suitable mode. Then transferring the cassette between the AGV and the process equipment occurs.

In another version of the invention, the method includes transmitting a second signal from the process equipment indicating authorization for the transfer of the cassette before the actual transferring occurs. In another version the checking step further comprises the step of sensing the position of the cassette on a cassette stage of the process equipment using a plurality of sensors.

In another aspect of the invention, a system for exchanging a cassette between an AGV and process equipment using the method comprises a host computer, an AGV controller, an AGV, process equipment, and a communications link between the AGV and the process equipment. The process equipment includes a cassette stage and a plurality of cassette sensors for detecting placement of the cassette at any position on the stage.

The invention provides several features which greatly reduce failure by ensuring that the process equipment is in a suitable mode before transferring occurs. In addition, by using a plurality of sensors, the occupancy of the cassette stage can be determined even if the cassette is not positioned at the preferred location on the stage.

BRIEF DESCRIPTION OF THE DRAWINGS

The foregoing and other objects, aspects, and advantages will be better understood from the following detailed description of the embodiments of the invention with reference to the drawings, in which.

DETAILED DESCRIPTION OF THE INVENTION

The invention is directed to a method and system for transferring semiconductor wafer cassettes with process equipment in a suitable mode.

Figure 3A:
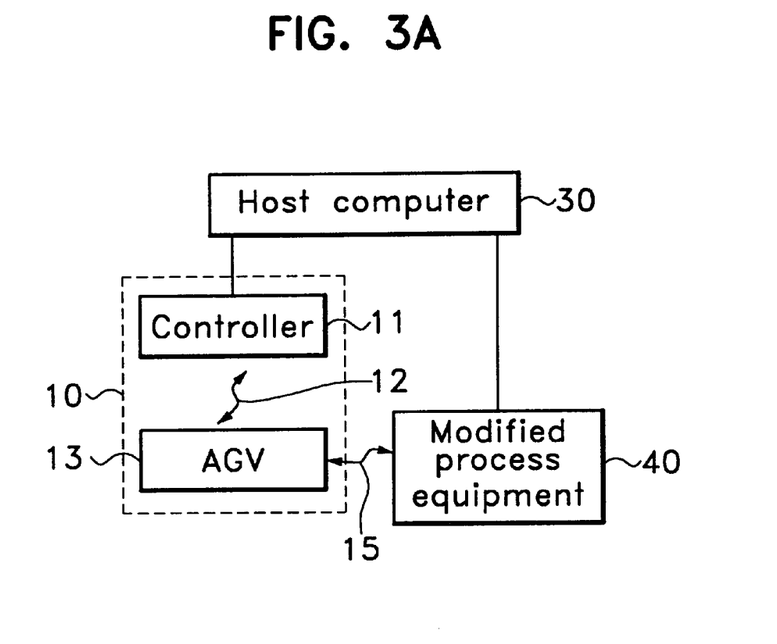
FIG. 3A is a schematic diagram of a wafer cassette transfer system using an embodiment of the present invention.
Figure 3B:
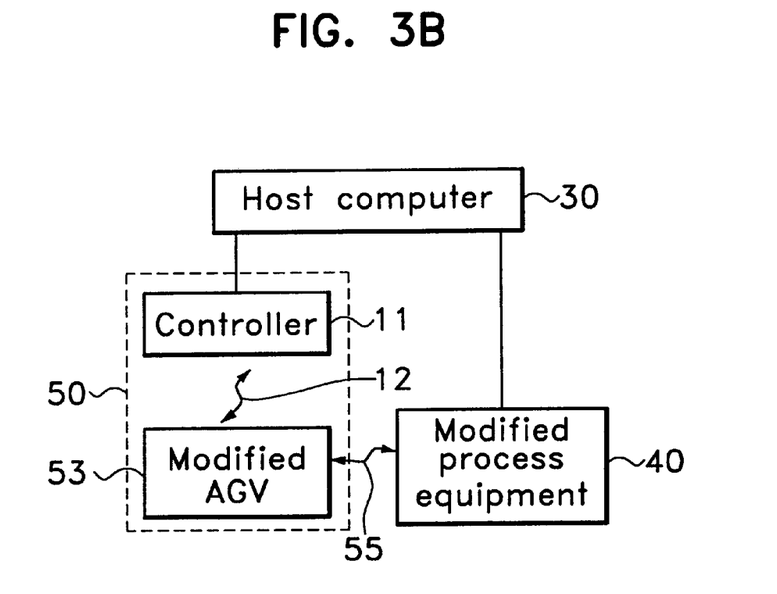
FIG. 3B is a schematic diagram of a wafer cassette transfer system using another embodiment of the present invention.

FIG. 3A illustrates a system for performing an embodiment of the method of the present invention. The wafer cassette transfer system has basically the same elements as previously described in FIG. 1, but the process equipment is modified to perform differently upon receiving communications from the AGV 13 through the communications link 15 and from the host computer 30. In other later described embodiments, such as shown in FIG. 3B, the AGV 53 is also modified to perform differently, and the communications link 55 passes different information between the process equipment 40 and the modified AGV 53.

Figure 4:
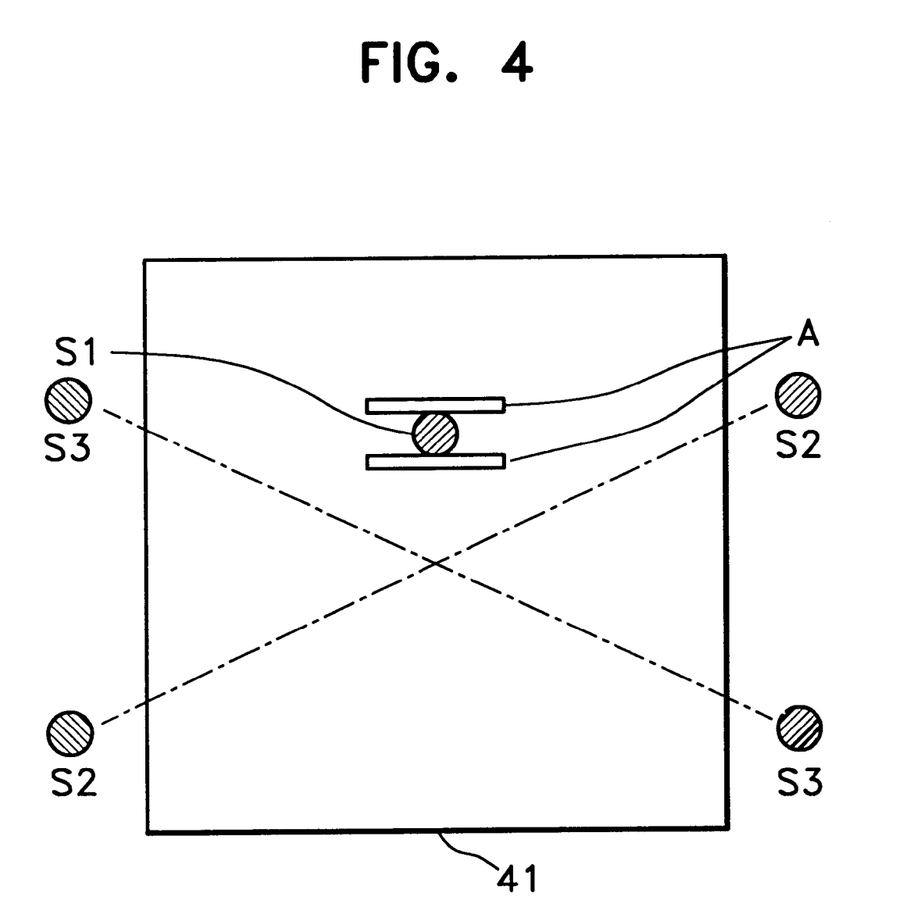
FIG. 4 is a schematic diagram showing an embodiment of the loading/unloading cassette stage of the modified process equipment of FIG. 3A and FIG. 3B according to the present invention.

FIG. 4 shows the loading/unloading cassette stage 41 of the modified process equipment 40 of the present invention. In one embodiment additional sensors are added to detect the position of cassettes on the stage 41; in the preferred embodiment two additional sensors S2 and S3 are added. The additional sensors may be beam type optical sensors, each having an emitter part and a detector part, for detecting the position of cassettes not placed in the preferred location A and therefore not sensed by the first sensor S1. In the preferred embodiment, the sensors S2 and S3 are located near the cassette stage 41 and need not be part of the cassette stage 41.

The operation of the transfer system according to the method of the present invention will now be described. For simplicity, the embodiments of FIG. 3A and FIG. 3B will be described simultaneously, where possible, referring to the AGV 13 in FIG. 3A and the modified AGV 53 in FIG. 3B.

Figure 5:
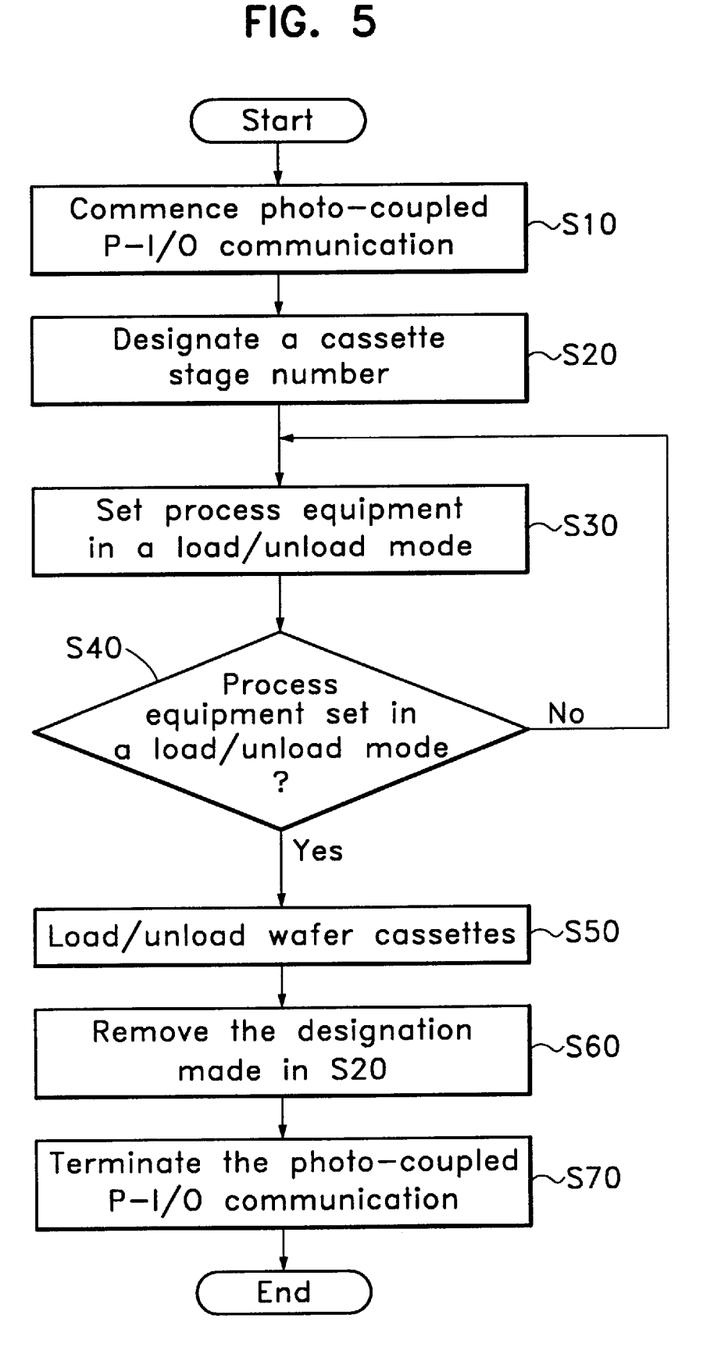
FIG. 5 is a flowchart showing the method for transferring wafer cassettes according to an embodiment of the present invention.

As shown in the flow chart of FIG. 5, the method of the present invention begins with step S10 in which the AGV 13, 53 initiates a communications link (15 in FIG. 3A and 55 in FIG. 3B) with the process equipment 40, using for example, a PPIO link as in the preferred embodiment. The AGV 13, 53 then transmits a request signal to the process equipment 40 in step S20. In the preferred embodiment, the signal would designate a cassette stage 41 by a cassette stage number. In step S30, the process equipment 40 sets itself into a suitable mode, i.e., the process equipment 40 sets the designated cassette stage 41 and associated internal mechanisms, if any, into states appropriate for the type of transfer (load or unload) commanded by the host computer 30 or the AGV 13, 53. Initially, this step S30 might be performed before the AGV 13, 53 arrives, based on a command from the host computer 30. In step S40, the process equipment 40 determines whether it is completely set in the suitable mode by checking the occupancy of the cassette stage 41 using the sensors provided, e.g., S1, S2 and S3 (FIG. 4) in the preferred embodiment, and by checking the internal mechanisms if any such checks are provided in the modified process equipment 40. If the result of step S40 is that the process equipment 40 is not in a suitable mode, step S30 is repeated, followed by another execution of step S40. This cycle can be repeated until the process equipment 40 is found to be in the suitable transfer mode during step S40.

When it is determined during step S40 that the process equipment 40 is in the suitable mode, then in step S50 a wafer cassette is transferred between the AGV 13, 53 and the process equipment 40. Execution of step S50 may be made to occur after step S40 determines the process equipment 40 is in a suitable mode, by delaying step S50 until an authorization signal is received by the modified AGV 53 from the process equipment 40 over the modified communications link 55 as in the preferred embodiment. Alternatively, the delay required of the unmodified AGV 13 can be predetermined or provided by the host computer 30 based on communications with the process equipment 40.

Finally, the method ends when the communications link 15, 55 is disestablished in steps S60 and S70. In the preferred embodiment, step S60 involves the removal of the signal designating the cassette stage number; and step S70 involves the termination of the PPIO link.

The method for loading a wafer cassette onto the process equipment 40 according to the preferred embodiment in FIG. 3B will be described in further detail with reference to FIG. 6.

Referring to FIG. 3B, the load operation begins with the host computer 30 issuing a load command to the controller 11 of the transfer equipment 50 and the controller (not shown) of the process equipment 40 according to the SECS. The controller 11 controls the movement of the modified AGV 53 through the radio link 12 to move to the process equipment 40 which is to be loaded. As a result the modified AGV 53 arrives at the process equipment 40 adjacent to its loading/unloading cassette stage 41.

After arrival at the process equipment 40, the modified AGV 53 begins to communicate with the process equipment 40 via the communications link 55. This corresponds to step S10 in FIG. 5.

Figure 6:
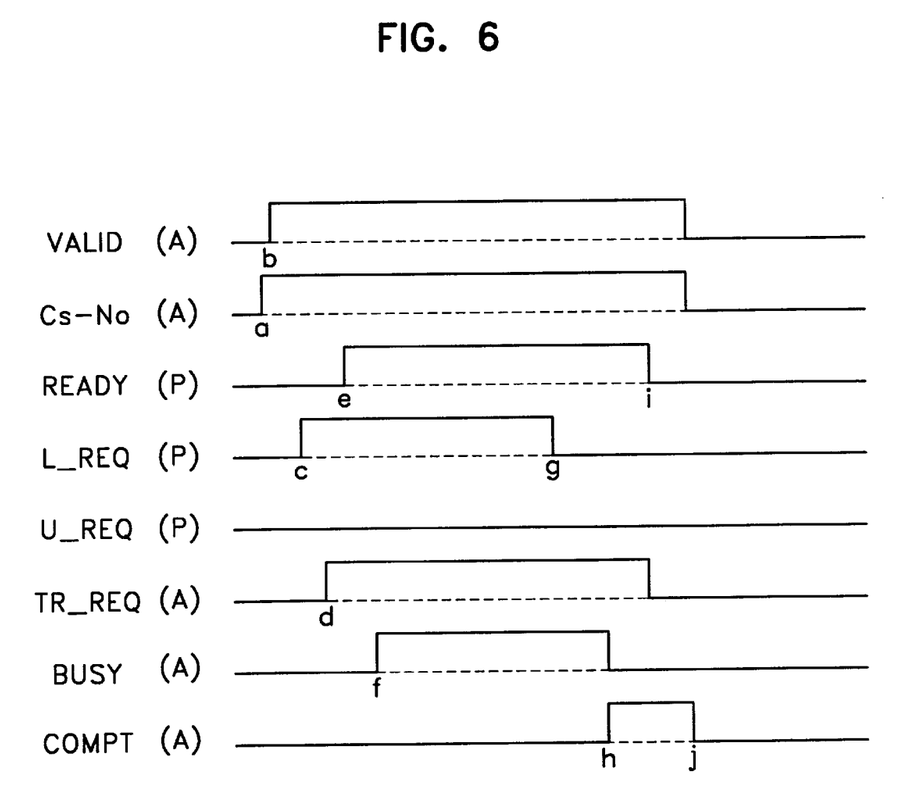
FIG. 6 is a timing chart for loading operations showing communications across the communications link between the process equipment and the AGV according to an embodiment of the present invention; and, FIG. 7 is a timing chart like FIG. 6 except for unloading operations.

The communications across the communications link 55 are shown in FIG. 6 as time charts of various signals. In FIG. 6, signals originating in the modified AGV 53 in FIG. 3B are followed by the letter A in parentheses, and signals originating in the process equipment 40 in FIG. 3B are followed by the letter P in parentheses. At time 'a' the modified AGV transmits a Cs-No signal designating a cassette stage number. The Cs-No signal represents the cassette stage number as CS_0, CS_1, CS_2, etc. Shortly thereafter, at time 'b', the modified AGV transmits a VALID status signal that is at a high level to indicate the status is ON. A VALID ON signal means that the cassette number transmitted by Cs-No is valid for the current process equipment 40 adjacent to the modified AGV 53. The Cs-No signal and VALID ON signal correspond to step S20 in FIG. 5.

Meanwhile, the process equipment 40 has begun step S30 to set itself into the ready for load mode. In the preferred embodiment, step S30 is begun based on the initial communication from the host computer 30 or based on a subsequent return of control from step S40 in FIG. 5. During step S30, for example, if a door is included in the process equipment 40, it is opened; if a robot arm is included it is unfolded. During step S30 the sensors S1, S2, and S3 determine whether a cassette is located anywhere on the cassette stage 41, and, if so, the cassette is removed by the process equipment 40 under the control of the process equipment controller (not shown).

After receiving the VALID ON signal from the modified AGV 53, the door sensors and arm sensors, if provided, of the process equipment 40 detect the state of the door and arm and provide the result to the process equipment controller (not shown). The cassette stage sensors S1, S2, and S3 detect the occupancy state of the cassette stage 41 and provide the result to the process equipment controller. Based on these results the process equipment controller determines whether the process equipment 40 is in the suitable mode, i.e., the ready for load mode. If it is determined that the process equipment is not in the ready for load mode, the method returns control to step S30. For example, if a door is not open, or a robot arm is not unfolded, or the cassette stage 41 is not empty, control returns to step S30. Even if a cassette is not in the preferred location A in FIG. 4 of the stage 41, the preferred embodiment of the present invention will detect that the stage 41 is not empty because of the additional sensors S2 and S3.

While the process equipment 40 is not in the ready for load mode, the status signal L_REQ remains at a low signal level indicating L_REQ OFF. The next step (S50) of the method to load the cassette, will not be performed while a L_REQ OFF signal is transmitted. Thus, transfer failures such as cassettes colliding with partly closed doors, or partly folded robot arms, or other cassettes already occupying a cassette stage 41 during the load operation are avoided.

When it is determined that the process equipment 40 is in the ready for load mode, the L_REQ status signal is changed to L_REQ ON at time 'c' by sending a high level signal. This corresponds to the end of step S40 in FIG. 5.

In the preferred embodiment, step S50 in FIG. 5 begins with the modified AGV 53 changing the TR_REQ status signal from a low level to a high level to indicate TR-REQ ON at time 'd'. This means that the modified AGV 53 is about to transfer the wafer cassette to the process equipment 40. The process equipment 40 responds by changing a READY status signal from a low level signal indicating READY OFF to a high level signal indicating READY ON at time 'e'. At time 'f', subsequent to time 'e', the physical transfer of the cassette from the modified AGV 53 to the process equipment 40 begins and the status signal BUSY is changed from a low level indicating BUSY OFF to a high level signal indicating BUSY ON.

Upon completion of the loading operation, the wafer cassette now placed on the cassette stage 40 is sensed by one or more of the sensors S1, S2 and S3. At this time, time 'g', the process equipment 40 converts the high level signal indicating L_REQ ON to a low level signal indicating L_REQ OFF in the status signal L_REQ being transmitted to the modified AGV 53. In response, the modified AGV 53 converts the status signal BUSY transmitted to the process equipment 40 from a high level indicating BUSY ON to a low level indicating BUSY OFF at time 'h'. Also at time 'h', the status signal COMPT transmitted from the modified AGV 53 to the process equipment 40 is changed from a low level indicating COMPT OFF to a high level indicating COMPT ON to represent that the loading operation has completed. This corresponds to the completion of step S50 in FIG. 5.

In response to the COMPT ON signal, at time 'i' the process equipment 40 converts the status signal READY transmitted to the modified AGV 53 from a high level indicating READY ON to a low level indicating READY OFF.

In response to the READY OFF signal, at time 'j', the modified AGV 53 converts the BUSY, VALID, and Cs-No signals transmitted to the process equipment 40 from high levels to low levels indicating BUSY OFF, VALID OFF, and Cs-No OFF, respectively. The change to Cs-No OFF at time 'j' corresponds to removing the designation of the cassette stage number in step S60 in FIG. 5.

When the designation of the cassette stage number is removed, the modified AGV 53 terminates the PPIO link with the process equipment 40 corresponding to step S70 in FIG. 5. In the event that there is not another subsequent transfer operation with the current process equipment 40, the modified AGV 53 moves away from the process equipment 40.

The method for unloading a wafer cassette from the process equipment 40 according to the preferred embodiment will be described in further detail with reference to FIG. 3B and FIG. 7. The method is the same and the details are similar to that described immediately above in detail for the load operation, except for the use of a different status signal, U_REQ instead of L_REQ, the suitable mode being ready for unload rather than ready for load.

As described above and shown in FIG. 3B, the modified AGV 53 arrives at the process equipment 40 adjacent to its loading/unloading cassette stage 41. After arrival at the process equipment 40, the modified AGV 53 begins to communicate with the process equipment 40 via the communications link 55. This corresponds to step S10.

Figure 7:
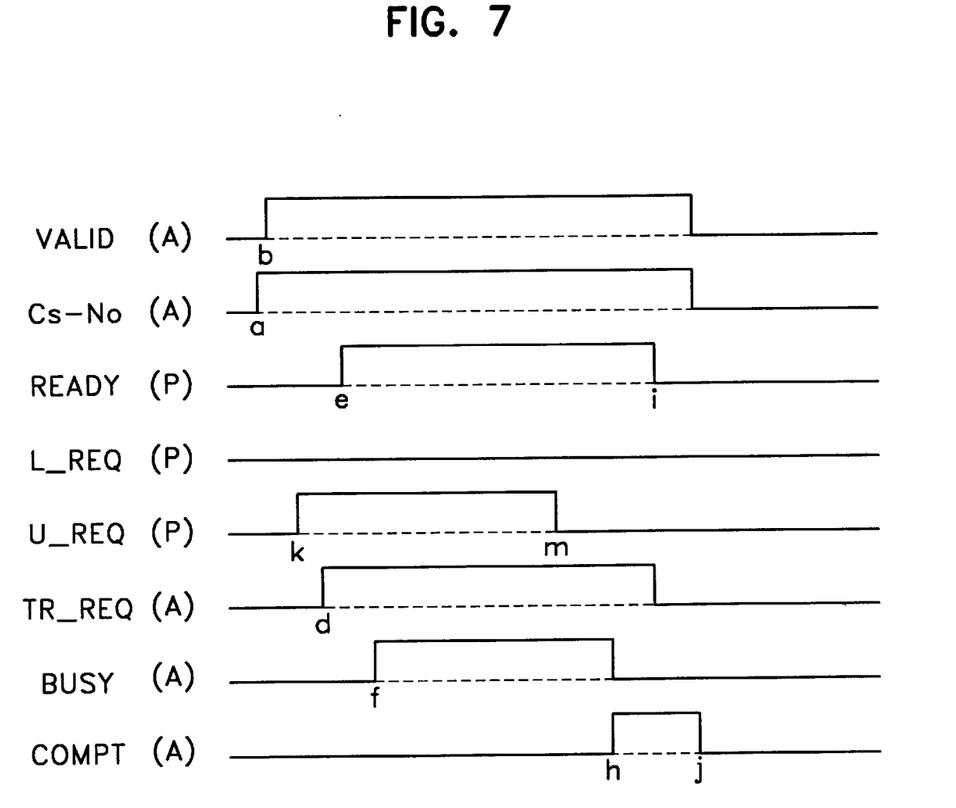

The communications across the communications link 55 are shown in FIG. 7 as time charts of various signals during the unload operation. In FIG. 7, signals originating in the modified AGV 53 are followed by the letter A in parentheses, and signals originating in the process equipment 40 are followed by the letter P in parentheses. The modified AGV transmits a Cs-No signal designating a cassette stage number at time 'a'. The Cs-No signal represents the cassette stage number as CS_0, CS_1, CS_2, etc. The modified AGV transmits a VALID status signal at time 'b' that is at a high level to indicate the status is ON. A VALID ON signal means that the cassette number transmitted by Cs-No is valid for the current process equipment 40 adjacent to the modified AGV 53. This pair of signals correspond to step S20.

Meanwhile, the process equipment 40 has begun step S30 to set itself into the ready for unload mode. In the preferred embodiment, step S30 is begun based on the initial communication from the host computer 30 or based on a subsequent return of control from step S40.

During step S30, for example, if a door is included, it is opened; if a robot arm is included it is unfolded. During step S30, the sensors S1, S2, and S3 determine whether a cassette is located anywhere on the cassette stage 41; and, if not, a cassette is placed on the stage 41 by the process equipment 40 under the control of the process equipment controller (not shown).

After receiving the VALID ON signal from the modified AGV 53 the door sensors and arm sensors, if any, of the process equipment 40 detect the state of the door and arm and provide the result to the process equipment controller (not shown). The cassette stage sensors S1, S2, and S3 detect the occupancy state of the cassette stage 41 and provide the result to the process equipment controller. Based on these results the process equipment controller determines whether the process equipment 40 is in the suitable mode, i.e., the ready for unload mode. If it is determined that the process equipment is not in the ready for unload mode, the method returns control to step S30. For example, if a door is not open, or a robot arm is not unfolded, or the cassette stage 41 is not occupied, control returns to step S30. Even if a cassette is not in the preferred location A of the stage 41, the preferred embodiment of the present invention will detect that the stage 41 is occupied because of the additional sensors S2 and S3.

While the process equipment 40 is not in the ready for unload mode, the status signal U_REQ remains at a low signal level indicating U_REQ OFF. The next step (S50) to unload the cassette, will not be performed while a U_REQ OFF signal is transmitted. Thus, transfer failures such as cassettes colliding with partly closed doors, or partly folded robot arms, or having no cassette to unload on a cassette stage 41 during the unload operation are avoided.

When it is determined that the process equipment 40 is in the ready for unload mode, the U_REQ status signal is changed to U_REQ ON at time 'k' by sending a high level signal. This corresponds to the end of step S40.

Step S50 in the preferred embodiment begins with the modified AGV 53 changing the TR_REQ status signal from a low level to a high level to indicate TR_REQ ON at time 'd'. This means that the modified AGV 53 is about to transfer the wafer cassette from the process equipment 40. The process equipment 40 responds by changing a READY status signal from a low level signal indicating READY OFF to a high level signal indicating READY ON at time 'e'. At time 'f', subsequent to time 'e', the physical transfer of the cassette to the modified AGV 53 from the process equipment 40 begins and the status signal BUSY is changed from a low level indicating BUSY OFF to a high level signal indicating BUSY ON.

Upon completion of the unloading operation, the absence of a wafer cassette on the cassette stage 40 is sensed by all of the sensors S1, S2 and S3. At this time, time 'm', the process equipment 40 converts the high level signal indicating U_REQ ON to a low level signal indicating U_REQ OFF in the status signal U_REQ being transmitted to the modified AGV 53. In response, the modified AGV 53 converts the status signal BUSY transmitted to the process equipment 40 from a high level indicating BUSY ON to a low level indicating BUSY OFF at time 'h'. Also at time 'h', the status signal COMPT transmitted from the modified AGV 53 to the process equipment 40 is changed from a low level indicating COMPT OFF to a high level indicating COMPT ON to represent that the unloading operation has completed. This corresponds to the completion of step S50.

In response to the COMPT ON signal, at time 'i' the process equipment 40 converts the status signal READY transmitted to the modified AGV 53 from a high level indicating READY ON to a low level indicating READY OFF.

In response to the READY OFF signal, at time 'j', the modified AGV 53 converts the BUSY, VALID, and Cs-No signals transmitted to the process equipment 40 from high levels to low levels indicating BUSY OFF, VALID OFF, and Cs-No OFF, respectively. The change to Cs-No OFF at time 'j' corresponds to removing the designation of the cassette stage number in step S60.

When the designation of the cassette stage number is removed, the modified AGV 53 terminates the PPIO link with the process equipment 40 corresponding to step S70. In the event that there is not another subsequent transfer operation with the current process equipment 40, the modified AGV 53 moves away from the process equipment 40.

As described above, the method of the present invention prevents many failures of the wafer cassette transfer process by checking that the process equipment 40 is in a suitable mode before performing the transfer. A system embodiment of the present invention that permits the performance of the preferred embodiment of the method requires that additional sensors S2 and S3 be placed near the loading/unloading cassette stage 41 of the process equipment 40. The additional sensors S2 and S3 are used to detect the position of a cassette that is not located at the preferred location A in FIG. 4 on the stage 41.

It is understood that many modifications are contemplated within the practice of the present invention. Specifically, the placement of sensors to detect the positions of cassettes at locations other than the preferred location can be varied widely. Also, the number of status signals passed back and forth between the AGV and the process equipment can be varied down from the eight described in the preferred embodiment. In addition, communications links other than the PPIO link can readily be employed.

It will be apparent to those skilled in the art that various modifications and variations can be made in the system and method of the present invention without departing from the spirit or scope of the invention. Thus, it is intended that the present invention cover the modifications and variations of this invention provided they come within the scope of the appended claims and their equivalents.

What is claimed is:

1. A method for transferring a wafer cassette between an Automated Guide Vehicle (AGV) and process equipment in a semiconductor fabrication facility, the method comprising the steps of:

when the AGV arrives at the process equipment, transmitting a first signal, indicative of a cassette transfer request, from the AGV to the process equipment;

before the wafer cassette is transferred between the AGV and the process equipment, checking whether the process equipment is in a transfer mode, the process equipment when in said transfer mode being in a physical state ready and suitable for the transfer of the wafer cassette between the AGV and the process equipment;

setting the process equipment to said transfer mode after the checking step if the process equipment was not already in said transfer mode;

as long as the checking reveals that the process equipment is not yet in said transfer mode, postponing the transfer of a wafer cassette between the AGV and the process equipment and continuing to check whether the process equipment is in said transfer mode;

transmitting a second signal representative of a cassette transfer authorization once the process equipment is in said transfer mode; and transferring the cassette between the AGV and the process equipment once said first and second signals have been transmitted so as to avoid a mis-handling of the wafer cassette during the transferring of the cassette.

2. The method of claim 1, wherein the second signal, indicative of a cassette transfer authorization, is transmitted directly from the process equipment to said AGV.

3. The method of claim 2, wherein at least one of the transmitting steps comprises establishing a wireless communications link.

4. The method of claim 3, wherein the wireless communications link is a photo-coupled Parallel Input/Output communications link.

5. The method of claim 1, wherein the process equipment is in said transfer mode when a cassette is no longer present on the cassette stage, and the checking step comprises sensing for the presence of the cassette at any one of several different locations on a cassette state of the process equipment using a plurality of sensors.

6. The method of claim 5, wherein a first sensor of the plurality of sensors detects a position of the cassette at a preferred location on the stage.

7. A system for processing wafers stored in a cassette in a semiconductor fabrication facility, the system comprising:

a host computer;

an AGV controller connected to the host computer;

an AGV communicating with the AGV controller;

a piece of process equipment connected to the host computer;

a wafer cassette-supporting surface of a cassette stage housed within the process equipment, said wafer cassette-supporting surface configured to support the cassette thereon in the course of transferring the cassette between the AGV and the process equipment;

a plurality of cassette sensors fixed in place relative to said wafer-cassette supporting surface of the cassette stage and oriented to detect the presence of the cassette anywhere on the wafer-cassette supporting surface; and a communications link between the AGV and the process equipment.

8. The system of claim 7, wherein the communications link is a wireless communications link.

9. The system of claim 8, wherein the wireless communications link is a photo-coupled Parallel Input/Output communications link.

10. The system of claim 7, wherein said plurality of cassette sensors includes a first sensor positioned and oriented to detect the presence of the cassette at a preferred location on said wafer-cassette supporting surface of the cassette stage.

11. The method of claim 1, wherein the checking is a self-check carried out by the process equipment itself, and said transmitting of the second signal is carried out by said process equipment once said process equipment is in said transfer mode.

12. The method of claim 11, wherein said transmitting of the second signal, indicative of a cassette transfer authorization, comprises the process equipment converting the level of a signal between a high level and a low level.

13. The method of claim 1, wherein said checking step comprises checking whether a door of the process equipment has opened completely.

14. The method of claim 1, wherein said checking step comprises checking whether a robot arm of the process equipment has articulated to a predetermined position.

15. The method of claim 1, wherein said checking step comprises checking whether a wafer cassette is present on a wafer stage of the process equipment.

16. The method of claim 1, wherein said setting of the process equipment to said transfer mode is initiated by a host computer.

* * * * *